United States Patent [19]

Driscoll

[11] Patent Number: 4,797,639
[45] Date of Patent: Jan. 10, 1989

[54] LOW NOISE CRYSTAL CONTROLLED OSCILLATOR

[75] Inventor: Michael M. Driscoll, Baltimore, Md.

[73] Assignee: The United States of America as represented by the Secretary of the Air Force, Washington, D.C.

[21] Appl. No.: 57,461

[22] Filed: May 22, 1987

[51] Int. Cl.$^4$ .............................................. H03B 5/32
[52] U.S. Cl. ...................................... 331/158; 331/77
[58] Field of Search .................. 331/158, 159, 116 R, 331/116 FE, 77

[56] References Cited

U.S. PATENT DOCUMENTS

| | | | |
|---|---|---|---|
| 4,160,183 | 7/1979 | Kusters et al. | 310/315 |
| 4,520,326 | 5/1985 | Clemens | 331/116 R |
| 4,536,721 | 8/1985 | Charbonnier | 331/116 R |
| 4,577,165 | 3/1986 | Uehara et al. | 331/109 |
| 4,580,109 | 4/1986 | Lockwood | 331/117 FE |
| 4,600,900 | 7/1986 | Renoult et al. | 331/116 R |

Primary Examiner—Siegfried H. Grimm
Attorney, Agent, or Firm—Donald J. Singer; Jacob N. Erlich; Richard J. Donahue

[57] ABSTRACT

A low noise crystal controlled oscillator utilizes a single low impedance modular amplifier in conjunction with matching low impedance fixed element subcircuits to achieve predictable and repeatable frequency stability. A low component count enhances circuit reliability.

6 Claims, 1 Drawing Sheet

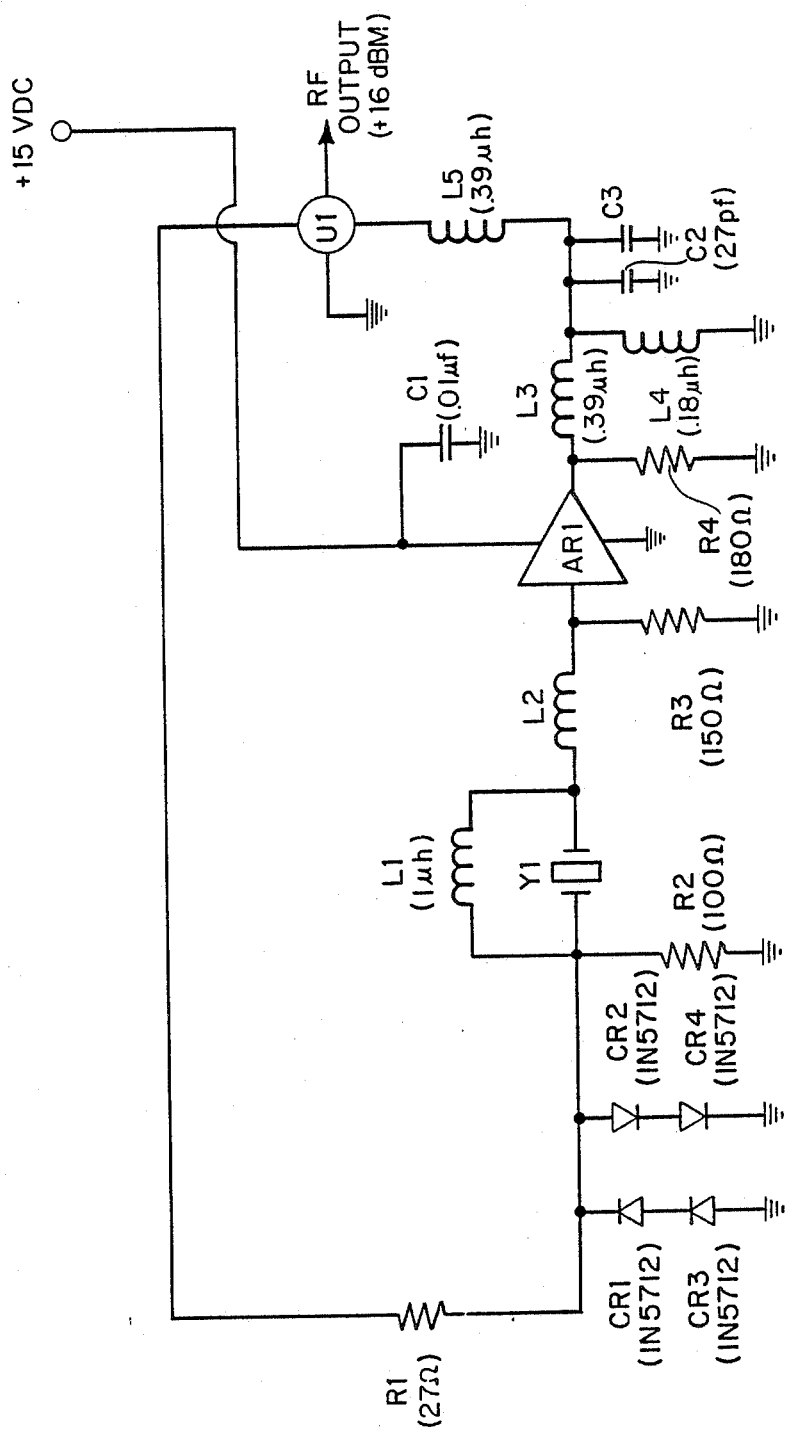

LOW NOISE CRYSTAL CONTROLLED OSCILLATOR

STATEMENT OF GOVERNMENT INTEREST

The invention described herein may be manufactured and used by or for the Government for governmental purposes without the payment of any royalty thereon.

BACKGROUND OF THE INVENTION

The present invention concerns a crystal oscillator configuration, the functional portions of which consist of individual 50 ohm subcircuits, and whose overall component count and circuit complexity is minimized.

In conventional low noise crystal oscillator circuits, the oscillator sustaining (gain) stage consists of one or more discrete transistors having low emitter impedance and moderate to high base and collector impedances referred to circuit ground. These impedances are usually substantially reactive, due to device junction capacitance and lead inductance. Also, in order to achieve adequate device gain, the transistors that are used must exhibit gain-bandwidth products that are well in excess of the oscillator operating frequency.

For example, a 100 megahertz oscillator circuit typically uses transistors having gain-bandwidth products of 1-3 gigahertz. The resulting circuit has several undesireable features, namely:

(1) The external circuitry to which the transistors are connected, including unavoidable printed circuit board track capacitance and inductance, result in marginal stability and sometimes instability (oscillation) of the device at frequencies above the desired operating frequency. Furthermore, this instability may be dependent on the operating temperature of the oscillator circuit, unit to unit component tolerances, or the manufacturers selected to provide the components used in the oscillator circuit. Moreover, such instabilities are not always observable in the engineering prototype circuits.

(2) Component screening for undesireable RF performance prior to circuit assembly is often inadequate, since the screening process often utilizes 50 ohm test equipment that does not adequately simulate the actual interface impedances.

(3) Additional components are often required in such typical oscillator circuits in order to suppress unwanted device instabilities and to match the impedance of the crystal and the other oscillator functional subcircuits to that of the discrete transistors. The resultant large component count and the usual use of variable or adjustable components further reduces the reliability of the oscillator circuit.

SUMMARY OF THE INVENTION

It is therefore the primary object of the present invention to provide a low-noise oscillator circuit of simplified construction and improved reliability.

In accordance with the present invention, a low noise crystal controlled oscillator has been constructed which utilizes a single, self-contained, 50 ohm amplifier as the oscillator sustaining stage. An SC-cut crystal resonator is operated at series resonance and is imbedded in a resistive feedback circuit that also includes a symmetrical Schottky diode limiter configuration, allowing linear amplifier operation. Also, included in the oscillator (positive) feedback loop is a 50 ohm, fixed element tuned circuit that simultaneously: prevents oscillation at undesired crystal vibrational modes; accurately compensates for inverting amplifier phase shift and delay; provides substantial suppression of amplifier ouput signal harmonic content; and provides the matched output impedance required to obtain maximum isolation between the oscillator and the load circuit via a 50 ohm broadband power divider that is also included in the oscillator circuit for extraction of useful output power.

Oscillator signal near-carrier phase noise level is determined by the short-term frequency of the crystal itself due to the low 1/f phase noise and linear operation of the amplifier. Oscillator signal noise floor level is determined by the amplifier input signal level and noise figure. Noise floor levels of −173 dB/Hz were measured for the oscillator circuit described herein using amplifiers at 3 dBm input drive. Higher amplifier drive and lower noise floor is possible with the novel circuit configuration at the expense of higher crystal loading, when a higher compression point amplifier is used. Under these circumstances near carrier noise will not be degraded because the dominant near carrier noise source is the crystal itself and not the sustaining stage amplifier.

The design of the sustaining stage amplifier, now available from multiple suppliers in the industry, is such that in addition to having low 1/f noise and very high reliability typical mean time between failure is $8 \times 10^5$ hours) exhibits unconditional stability. The amplifier is guaranteed to operate in a stable manner, free from unwanted oscillations. Therefore, printed circuit board and component stray capacitances will not adversely influence circuit reliability. In addition, a low overall circuit component count increases circuit reliability.

Because each of the functional subcircuits, i.e., the amplifier, power divider, fixed element tuned circuit, and crystal resistive network, are designed to operate between 50 ohm source and load impedances, the performance of the subcircuits and combinations thereof can be accurately characterized and verified using 50 ohm test equipment, such as an automatic network analyzer (for RF impedance and transmission parameter measurements) and a spectrum analyzer (for RF carrier noise measurements). This facilitates the accurate prediction of overall circuit performance and the screening of components to enhance circuit reliability.

BRIEF DESCRIPTION OF THE DRAWINGS

The foregoing and other objects, advantages and features of the present invention will become apparent from the following detailed description of the preferred embodiment thereof, as illustrated in the accompanying drawing, in which:

The sole FIGURE is a schematic diagram of the preferred embodiment of the present invention.

DETAILED DESCRIPTION OF THE INVENTION

The sole figure in the drawings is a schematic diagram of the preferred embodiment of the oscillator circuit of the present invention that was designed to operate using a third overtone, 80 mHz, SC cut crystal resonator. As shown in the figure, the circuit consists of a 20 dB gain modular amplifier AR1, a tuned circuit comprising inductors L3–L5 and capacitors C2 and C3, a power divider U1, a Schottky diode limiter arrangement CR1–CR4 and a crystal resonator Y1 which, operated at series resonance, forms part of a resistive pad.

The Schottky diodes CR1-CR4 provide RF signal limiting and allow amplifier operation below the compression point of amplifier AR1. The value of resistor R1 is selected to present a matched (50 ohm) impedance to the power divider U1. The values of resistors R2, R3 are selected in conjunction with the series resistance of quartz crystal Y1 to provide a desired small signal excess gain of 4 to 5 dB, crystal dissipation of 7 dBm, and an amplifier input drive of 2 dBm. The component values in parenthesis are those that were used in a prototype model of the oscillator circuit. Modular amplifier AR1, which has a gain of 20 dB and a 24 dBm compression point is a Q-Bit Corporation Type QBH-125, and power divider U1 is a zero degree (in phase) device manufactured by the Adams-Russell Company and is their part No. D5-109. The value of capacitor C3 is determined during testing of the oscillator circuit on a particular printed circuit board. Its value will vary in accordance with the track inductance and capacity of a particular printed board layout. Inductor L2 is used to lower the series resonant frequency by a slight amount, if this is required. In certain instances, inductor L2 can be eliminated, or be replaced by a capacitor which raises the series resonant frequency by a small amount.

The tuned circuit (L3-L5, C2, C3) must exhibit enough selectivity to suppress oscillation at the SC-cut crystal B mode approximately 10% above the operating frequency. A tuned circuit bandwidth of 10 to 15% suffices. The tuned circuit should also ideally exhibit a signal phase shift at the point of minimum loss equal to and opposite of that amplifier AR1. Because of amplifier delay, the required phase shift is not 180 degrees, but approximately 150 degrees. This can be achieved in the oscillator circuit by selecting arctan $(2\pi fL5/RL) \simeq$ arctan $(2\pi fL3/RS) \simeq 150/2 = 75$ degrees, where RS and RL are the tuned circuit source and load impedances (i.e., 50 ohms). R4 is included in the circuit to provide a matched tuned circuit impedance of 50 ohms (at the operating frequency) so that maximum power divider input output isolation is achieved. The use of resistor R4 is required as a result of losses in inductors L3, L4, and L5. The tuned circuit additionally affords excellent harmonic rejection. Output signal harmonics for the circuit were measured below $-60$ dBc.

Phase noise sideband spectra was measured by comparing the signals from two such prototype crystal oscillators operating at 80 MHz. Resonator short term stability measurements were made by driving each crystal in a phase bridge, from a common signal generator into a phase detector. The 100 Hz phase noise level was $-145$ dB/Hz, corresponding to a phase noise density of $6.3 \times 10^{-5}$ rad$^2$/Hz. In the phase bridge, the transmission phase slope was $2 \times 10^{-3}$ rad/Hz. The measured phase noise can be converted to a crystal resonator frequency noise of $1.6 \times 10^{-9}$ Hz$^2$/Hz, which corresponds to a predicted combined noise sideband level of $-131$ dB/Hz for two oscillators incorporating the two crystals. This is within 1 dB of that measured for the two prototype oscillators, and shows that the oscillator near carrier noise is due to crystal instability and not amplifier phase noise. The noise floor level of $-170$ dB/Hz for two oscillators ($-173$ dB/Hz for each oscillator) is consistent with a 2 dBm amplifier drive and a 3 dB noise figure.

The disclosed circuit contains no adjustable elements and approximately one third to one half of the number of components used in previously known production crystal oscillator circuits. The use of limiter diodes and the use of the crystal in a resistive network result in reliable circuit operation (more excess gain) over a wide temperature range with no adjustments and a low phase noise (due to linear amplifier operation). The disclosed circuit can be used with a variety of acoustic resonators such as SAW resonators and non-quartz piezoelectric bulk wave resonators.

Although the invention has been described with reference to a particular embodiment thereof, it will be understood to those skilled in the art that the invention is capable of a variety of alternative embodiments within the spirit and scope of the appended claims.

What is claimed is:

1. A low noise crystal oscillator circuit comprising:
    a modular type amplifier having an input, an output, and a ground reference terminal, said amplifier having an input impedance of substantially fifty ohms and an output impedance of substantially fifty ohms;
    a tuned circuit having an input, an output, and a ground reference terminal, said tuned circuit having its input coupled to the output of said amplifier, said tuned circuit having an input impedance of substantially fifty ohms and an output impedance of substantially fifty ohms;
    an RF signal output terminal;
    a power divider having an input, a first output, a second output, and a ground reference terminal, said power divider having its input coupled to the output of said tuned circuit and having its first output coupled to said RF signal output terminal, said power divider having an input impedance of substantially fifty ohms and an output impedance of substantially fifty ohms;
    a signal limiter circuit having an input, and output, and a ground reference terminal, said signal limiter circuit having its input coupled to the second output of said power divider, a first resistor coupled between the input and output of said signal limiter circuit, first diode means having its anode coupled to the output of said signal limiter circuit and its cathode coupled to the ground reference terminal of said signal limiter circuit, and second diode means having its cathode coupled to the output of said signal limiter circuit and its anode coupled to the ground reference terminal of said signal limiter circuit, said signal limiter circuit having an input impedance of substantially fifty ohms; and
    a crystal resonator circuit having an input, an output, and a ground reference terminal, said crystal resonator circuit having its input coupled to the output of said signal limiter circuit and its output coupled to the input of said amplifier, a crystal coupled between the input and the output of said crystal resonator circuit, and a second resistor coupled between the input of said crystal resonator circuit and the ground reference terminal of said crystal resonator circuit.

2. A low noise crystal oscillator circuit as defined in claim 1 wherein said tuned circuit includes first and second inductors joined in series between the input terminal of said tuned circuit and the output terminal of said tuned circuit, a third inductor and capacitor means connected in parallel between the junction of said first and second inductors and the ground reference terminal of said tuned circuit, and a third resistor connected between the input and the ground reference terminal of said tuned circuit.

3. A low noise crystal oscillator circuit as defined in claim 2 wherein said first diode means and said second diode means of said signal limiter unit each comprise a pair of series connected Schottky diodes.

4. A low noise crystal oscillator circuit as defined n claim 3 wherein said crystal resonator circuit includes a fourth inductor connected across said crystal, and wherein said crystal is coupled to the output of said crystal resonator circuit through a fifth inductor.

5. A low noise crystal oscillator circuit as defined in claim 4 wherein said crystal is an SC-cut crystal operated at series resonance.

6. A low noise crystal oscillator as defined in claim 5 wherein said capcitor means of said tuned circuit comprises first and second capacitors connected in parallel.

* * * * *